United States Patent
Thiruvengadam et al.

(10) Patent No.: US 9,786,345 B1
(45) Date of Patent: Oct. 10, 2017

(54) COMPENSATION FOR THRESHOLD VOLTAGE VARIATION OF MEMORY CELL COMPONENTS

(71) Applicant: Micron Technology, Inc., Boise, ID (US)

(72) Inventors: Aswin Thiruvengadam, Folsom, CA (US); Hernan A. Castro, Shingle Springs, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/267,807

(22) Filed: Sep. 16, 2016

(51) Int. Cl.
*G11C 11/16* (2006.01)
*G11C 11/22* (2006.01)

(52) U.S. Cl.
CPC ........ *G11C 11/221* (2013.01); *G11C 11/2259* (2013.01); *G11C 11/2273* (2013.01)

(58) Field of Classification Search
CPC ................................ G11C 11/16; G11C 11/22
USPC .................................................. 365/145, 158
See application file for complete search history.

(56) References Cited

U.S. PATENT DOCUMENTS

| | | | | |
|---|---|---|---|---|
| 5,455,786 A * | 10/1995 | Takeuchi | ................ | G11C 11/22 365/145 |
| 5,943,257 A * | 8/1999 | Jeon | ........................ | G11C 5/005 365/145 |
| 6,549,449 B2 * | 4/2003 | Takashima | ................ | G11C 7/12 365/145 |
| 7,012,829 B2 * | 3/2006 | Kawashima | ............ | G11C 11/22 365/145 |
| 7,133,304 B2 * | 11/2006 | Madan | ..................... | G11C 11/22 365/145 |
| 7,193,880 B2 * | 3/2007 | Madan | ..................... | G11C 11/22 365/145 |
| 7,203,087 B2 * | 4/2007 | Resta | ........................ | G11C 7/12 365/148 |
| 7,245,537 B2 * | 7/2007 | Jeong | ................... | G11C 16/102 365/185.18 |
| 7,366,004 B2 * | 4/2008 | Miyamoto | ............... | G11C 11/22 365/145 |
| 7,630,246 B2 * | 12/2009 | Roohparvar | ........ | G11C 11/5621 365/185.03 |
| 7,969,798 B2 * | 6/2011 | Hwang | ................... | G11C 5/147 365/163 |
| 8,248,875 B2 * | 8/2012 | Kajigaya | ................ | G11C 7/067 365/202 |
| 8,472,245 B2 * | 6/2013 | Kim | .................... | G11C 16/0483 365/185.03 |
| 8,531,870 B2 * | 9/2013 | Koyama | ............... | G11C 11/405 365/104 |

(Continued)

*Primary Examiner* — Michael Tran
(74) *Attorney, Agent, or Firm* — Holland & Hart LLP

(57) ABSTRACT

Methods, systems, and devices for operating a ferroelectric memory cell or cells are described. Before reading a memory cell, the voltage on an access line of the memory cell may be initialized to a value associated with the threshold voltage of a switching component in electronic communication with the memory cell. The voltage may be initialized by reducing the existing voltage on the access line to the value. The switching component or an additional pull down device, or both, may be used to reduce the voltage of the access line. After the access line has been initialized to the value, the read operation may be triggered.

23 Claims, 13 Drawing Sheets

(56) References Cited

U.S. PATENT DOCUMENTS

| | | | |
|---|---|---|---|
| 9,030,881 B2* | 5/2015 | Tokuhira | G11C 11/22 |
| | | | 365/145 |
| 9,286,987 B1* | 3/2016 | Dong | G11C 16/10 |
| 9,418,000 B2* | 8/2016 | Raghunathan | G11C 29/021 |

* cited by examiner

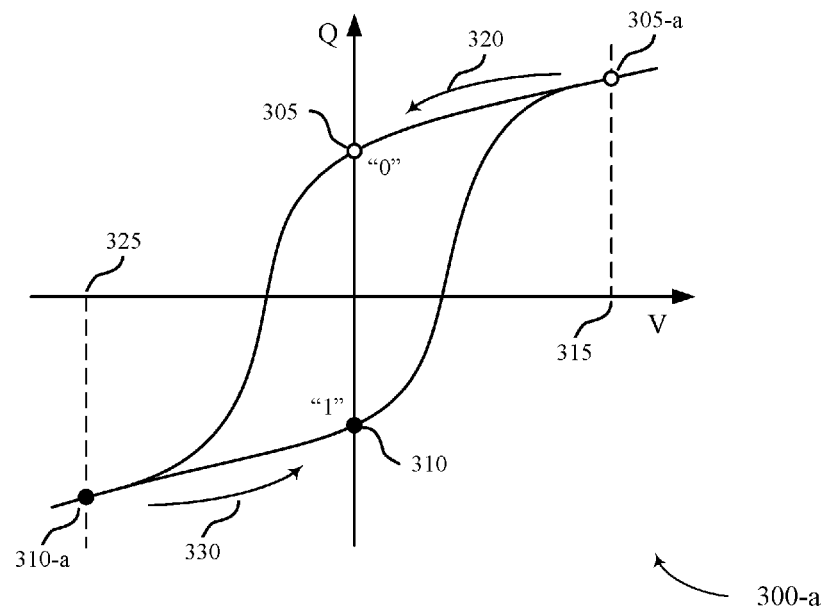
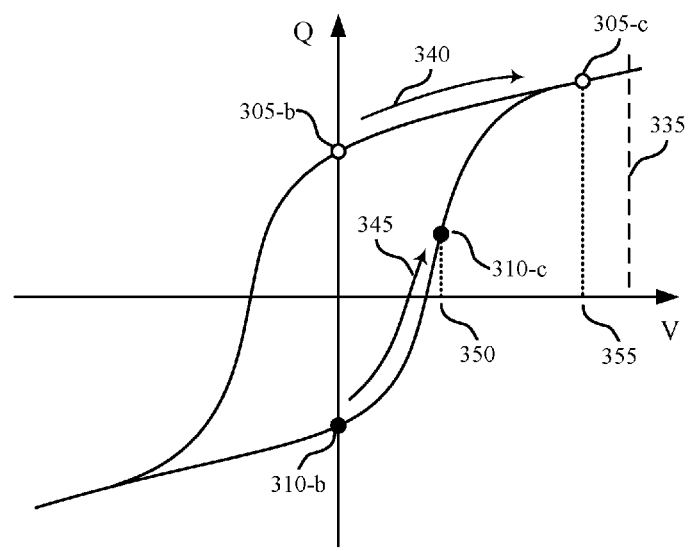
FIG. 3

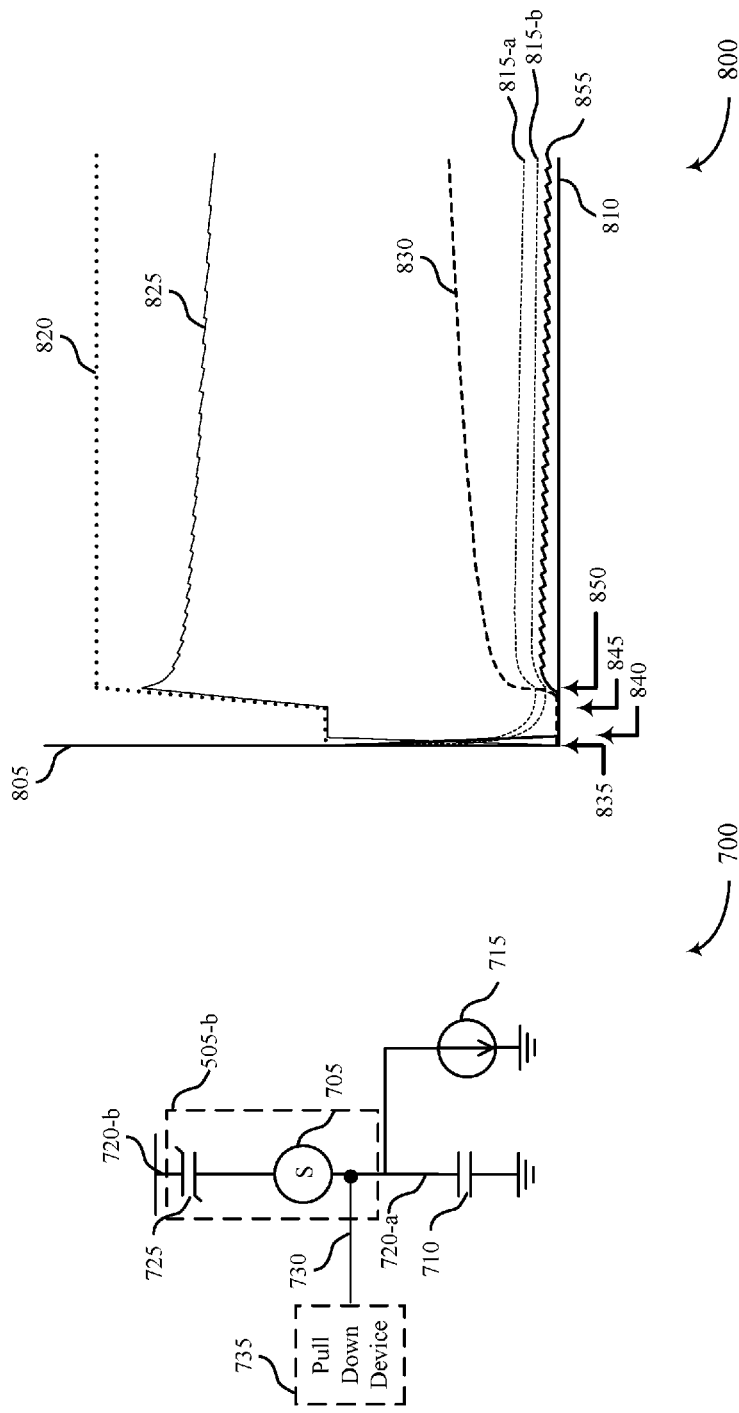

US 9,786,345 B1

COMPENSATION FOR THRESHOLD VOLTAGE VARIATION OF MEMORY CELL COMPONENTS

BACKGROUND

The following relates generally to memory devices and more specifically to compensation for threshold voltage variation within a memory array.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

FeRAM may use similar device architectures as volatile memory but may have non-volatile properties due to the use of a ferroelectric capacitor as a storage device. FeRAM devices may thus have improved performance compared to other non-volatile and volatile memory devices. A ferroelectric memory capacitor may store a signal that is indicative of a logic state. During a sense operation, the signal stored at the ferroelectric capacitor may be discharged onto an access line of the memory cell. In some cases, other components involved in the sense operation may introduce noise into the signal on the access line. This noise may corrupt the sensing operations of the device, resulting in inaccurate reads and decreased performance.

BRIEF DESCRIPTION OF THE DRAWINGS

FIG. 3 illustrates an example of a hysteresis plot for a ferroelectric memory cell that supports compensation for threshold voltage variation in accordance with embodiments of the present disclosure.

FIG. 7 illustrates an example circuit that supports compensation for threshold voltage variation in accordance with embodiments of the present disclosure.

FIG. 8 illustrates an example timing diagram that supports compensation for threshold voltage variation in accordance with embodiments of the present disclosure.

DETAILED DESCRIPTION

Figure 1:
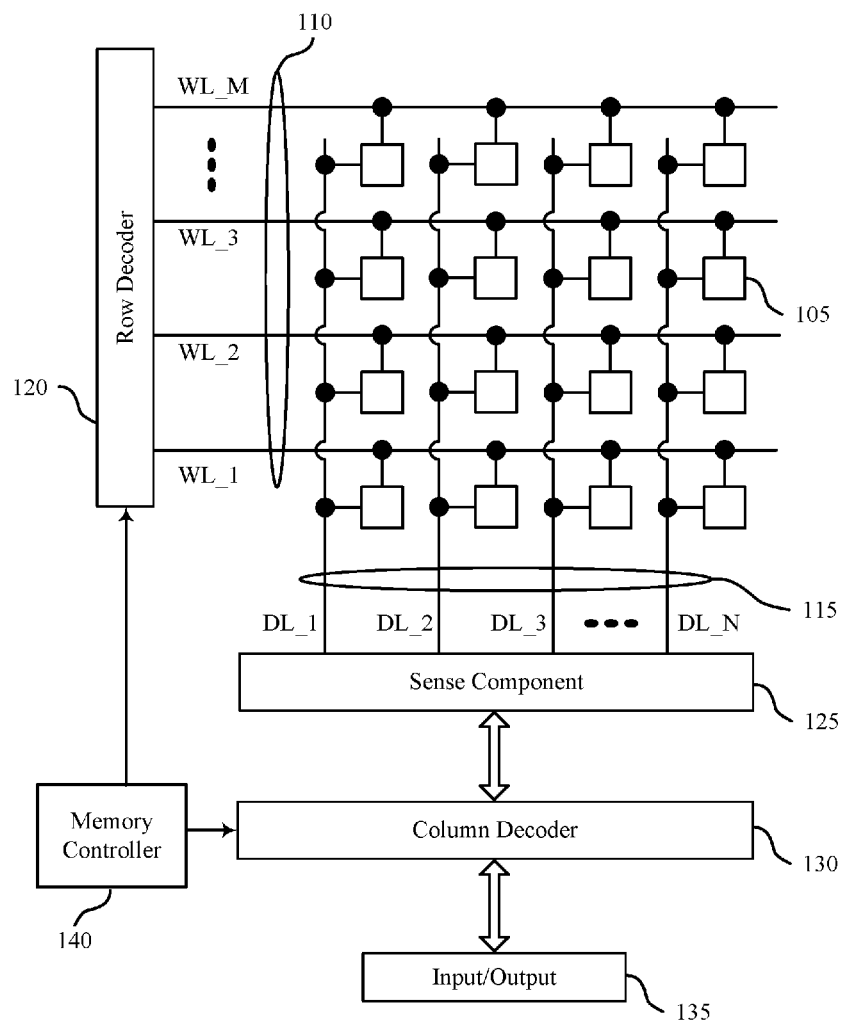
FIG. 1 illustrates an example of a memory array that supports compensation for threshold voltage variation in accordance with embodiments of the present disclosure.

The voltage on an access line of a memory cell may be initialized to a value that prevents corruption of the signal that is discharged by the memory cell during a read operation. For example, before a read operation of the memory cell, the voltage on an access line of the memory cell may be reduced to a value (e.g., a non-zero value) that compensates for variation in the threshold voltage of a switching component associated with the read operation.

Memory cells, including ferroelectric memory cells, within a memory array may be accessed by two access lines. The first access line may be a conductive line that the memory cells discharge onto during a read operation. The second access line may be a conductive line that controls access operations of the memory cells. Access operations of a memory cell include writing to the cell (e.g., storing a logic state) or reading the cell (e.g., reading a stored logic state). Each cell may have a storage component, for example a ferroelectric capacitor, that is used to store a logic value of the cell. A stored logic value may correspond to a respective state of the cell and may produce a signal (e.g., a voltage) on a digit line of the cell. The first access line may connect multiple memory cells and may be connected to a sense component that, when activated during a read operation, is used to determine the stored logic state of a memory cell.

For example, the sense component may detect the amount of charge output by a selected memory cell onto the first access line. In a conventional read operation, the first access line may be pulled down to ground (e.g., 0V) prior to the read operation so that when the memory cell discharges during the read operation, all of the signal sensed by the sense component is from the ferroelectric capacitor of the memory cell. But in some cases, a variation in the threshold voltage of a switching component coupled with the first access line may cause the voltage on the first access line to settle at a non-zero value (e.g., after the first access line has been pre-charged to 0V and before the cell starts to discharge). This non-zero voltage may corrupt the signal sensed by the sense component during a read operation. For example, polarization charge from the memory cell may be lost to charging up the first access line to the non-zero value.

As described herein, the voltage of the first access line may be reduced to a value associated with the threshold voltage of the switching component, rather than completely pulled down to ground. In some cases, the switching component itself may be used to reduce the voltage. In other cases, an additional device, which may be referred to as a "pull-down device," is used in combination with, or independent of, the switching component. Reducing the voltage on the first access line to the appropriate non-zero value may allow the sense component to sense the full signal stored at the cell.

Features and techniques introduced above are further described below in the context of a memory array. Specific examples are then described for compensation for threshold voltage variation during a read operation of a target memory cell. These and other features of the disclosure are further illustrated by and described with reference to apparatus diagrams, system diagrams, and flowcharts that relate to reading or writing non-volatile memory cells.

FIG. 1 illustrates an example memory array 100 that supports compensation for threshold voltage variation in accordance with various embodiments of the present disclosure. Memory array 100 may also be referred to as an electronic memory apparatus. Memory array 100 includes memory cells 105 that are programmable to store different states. Memory array 100 may be an example of a 2 dimensional (2D) memory array, where memory cells 105 are configured in a plane. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 and digit lines 115 may also be referred to as access lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a word line 110, and each column of memory cells 105 is connected to a digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line 115 may then be accessed to either read or write the memory cell 105. According to the techniques described herein, a digit line 115 may be initialized to a certain voltage value prior to reading the corresponding memory cell. For example, if the digit line 115 already has a non-zero voltage prior to a read operation, the voltage of the digit line 115 may be reduced to a threshold value associated with another component of the memory array 100.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltages used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, the memory controller 140 may reduce the voltage of the digit line 115 of a memory cell 105 prior to a sense operation. The memory controller 140 may control (e.g., activate and deactivate) a number of components to reduce the voltage. The final voltage on the digit line 115 after reduction may be associated with the threshold voltage of a component involved in the read operation. In some applications, the final voltage may be the threshold voltage of the component. In other applications, the final voltage is the difference between the actual threshold voltage of the component and an expected threshold voltage of the component (e.g., the final voltage may be the variation in the threshold voltage).

Figure 2:
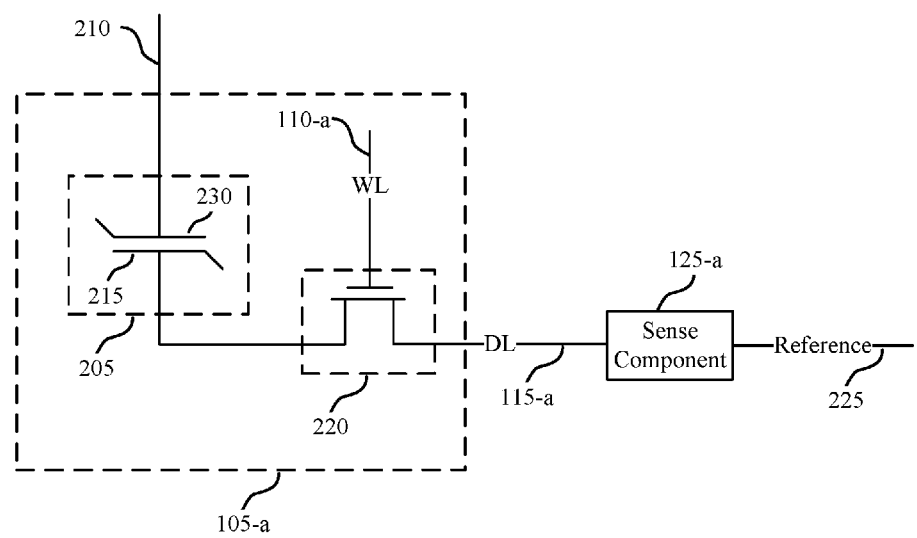
FIG. 2 illustrates an example circuit that supports compensation for threshold voltage variation in accordance with embodiments of the present disclosure.

FIG. 2 illustrates an example circuit 200 that supports compensation for threshold voltage variation in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving the cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that, during a sense operation, receives and compares the voltage of digit line 115-a and reference line 225, which may be a reference voltage. According to the techniques described herein, the voltage of digit line 115-*a* may be reduced to a predetermined value prior to the sense operation. Thus, the signal received by sense component 125-*a* may accurately reflect the amount of charge stored by memory cell 105-*a*. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

FIG. 3 illustrates an example of non-linear electrical properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage potential. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

In some cases, voltage 350 or voltage 355 may not accurately represent the charge stored at a memory cell 105. For example, if uncompensated, variations in the threshold voltages of various components involved in a read operation may result in variations in voltage 350 or voltage 355, which in turn may lead to read errors. As described herein, the variation in threshold voltages may be compensated for by initializing the digit line 115 to a value associated with the threshold voltage of the component at issue.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
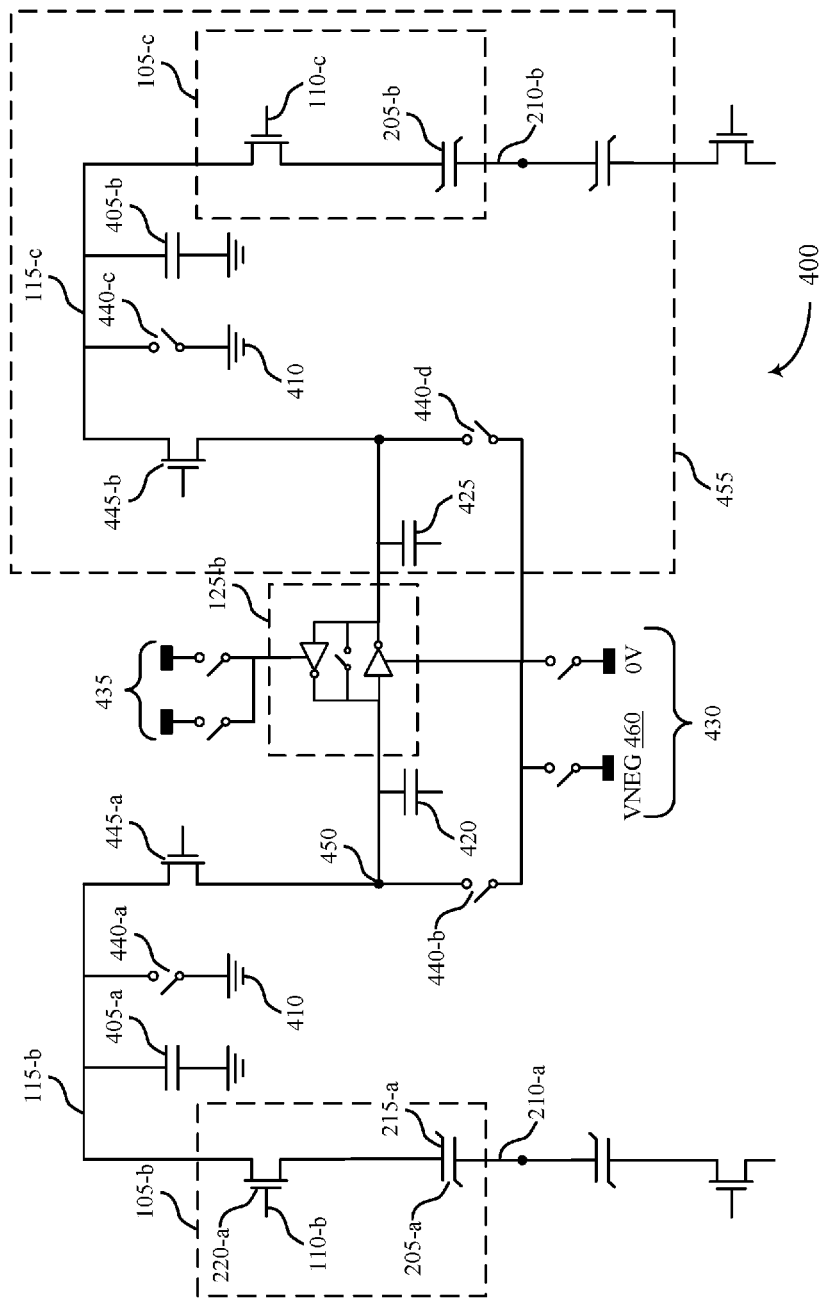
FIG. 4 illustrates an example circuit that supports compensation for threshold voltage variation in accordance with embodiments of the present disclosure.

FIG. 4 illustrates an example circuit 400 that supports compensation for threshold voltage variation in accordance with various embodiments of the present disclosure. Circuit 400 includes memory cell 105-b, which includes ferroelectric capacitor 205-a and selection component 220-a. Memory cell 105-b may be accessed using plate line 210-a and selection component 220-a may be controlled (e.g., activated or deactivated) using word line 110-b. When activated, selection component 220-a may provide a conductive path between cell bottom 215-a and digit line 115-b. Conversely, when deactivated, selection component 220-a may isolate cell bottom 215-a from digit line 115-b. According to the example depicted in circuit 400, digit line 115-b includes intrinsic digit line capacitance 405-a and is capable of being connected to virtual ground 410 via switch 440-a (also referred to herein as a pull down device). Circuit 400 also includes sense capacitor 420, reference capacitor 425, voltage source(s) 430, voltage source(s) 435, switch 440-b, and switching component 445-a. Switching component 445-a may, depending on its state, provide a conductive path, or isolation, between digit line 115-b and node 450 (and in turn sense capacitor 420). In some cases, switch 440-a and/or switch 440-b may, prior to a read operation, reduce the voltage of digit line 115-b to a value associated with the threshold voltage of switching component 445-a.

Reference component 455 may be configured to generate or produce a reference signal and, in some cases, may include circuitry to operate one or more ferroelectric memory cells 105 that act as reference cells. In some examples, reference component 455 includes memory cell 105-c, word line 110-c, and reference digit line 115-c, which may be examples of a memory cell 105, word line 110, and digit line 115, respectively, described with reference to FIGS. 1 and 2. Reference component 455 may also include capacitor 205-b and plate 210-b, which may be examples of capacitor 205 and plate 210, respectively, as described with reference to FIG. 2. Additionally, according to the example of FIG. 4, reference digit line 115-c includes intrinsic reference digit line capacitance 405-b. Reference component 455 may also include switch 440-c, switch 440-d, and switching component 445-b.

Digit line 115-b and reference digit line 115-c may have an intrinsic capacitance, which is represented by intrinsic digit line capacitance 405-a and 405-b, respectively. In the example of FIG. 4, intrinsic digit line capacitances 405-a and 405-b may not be an electrical device—e.g., it may not be a two-terminal capacitor. Instead, intrinsic digit line capacitance 405-a and 405-b may depend on the physical characteristics, including the dimensions, of digit line 115-b and reference digit line 115-c.

Virtual ground 410 may provide a virtual ground to digit line 115-b. Virtual ground 410 may be separated from digit line 115-b through a switch 440. In some examples, the switches 440 are transistors. Switching component 445-a may be a transistor connected in series with sense capacitor 420 and digit line 115-b. In some cases, the transistor comprises a p-type FET. Sense capacitor 420 and reference capacitor 425 may be capacitors configured to store charge (e.g., transferred from capacitor 205-a and capacitor 205-b, respectively) when memory cell 105-b is sensed. In some cases, sense capacitor 420 and reference capacitor 425 may have the same capacitance—e.g., sense capacitor 420 and reference capacitor 425 may have a common value or rating measured in farads. Reference capacitor 425 may be in electronic communication with reference component 455. In some cases, charge produced by reference component 455 may be stored on reference capacitor 425.

Sense component 125-b may determine the stored state of memory cell 105-b. Sense component 125-b may be or may include a sense amplifier. In some examples, sense component 125-b is operated by either voltage sources 430 or voltage source 435, or both. Sense component 125-b may also include sense capacitor 420. As depicted, ferroelectric memory cell 105-b is in electronic communication with digit line 115-b. Switching component 445-a, which is also in electronic communication with digit line 115-b, may be activated to virtually ground digit line 115-b (e.g., by activating switch 440-b). In some examples, switching component 445-a is a p-type FET.

Ferroelectric memory cell 105-b may store a logic value (e.g., a logic "1" or a logic "0") and may be identified for a read operation. For example, ferroelectric memory cell 105-b may be selected using a selection component 220-a. In some cases, selection component 220-a is a transistor (e.g., a FET) and that can be activated by applying a voltage to the gate of the transistor using word line 110-b. In a typical read operation, the voltage of digit line 115-b may be reduced to virtual ground prior to sensing the ferroelectric memory cell 105-b. For example, the voltage of digit line 115-b may be reduced to 0V by activating switch 440-a. Next, voltage is applied to plate line 210-a (and selection component 220-a is activated) so that digit line 115-b charges to a value indicative of the logic stated stored by ferroelectric memory cell 105-*b*. But in some cases, the variation in threshold voltage of switching component 445-*a* may prevent digit line 115-*b* from maintaining 0V after switch 440-*a* is deactivated.

For example, if the actual threshold voltage of switching component 445-*a* is different than the expected threshold voltage of switching component 445-*a* (e.g., the voltage applied at the gate of switching component 445-*a*), the voltage on digit line 115-*b* may pulled from 0V after release of switch 440-*a*, resulting in a net charge (positive or negative) on digit line 115-*b*. The resulting or final voltage on digit line 115-*b* may be a function of the difference between the actual and expected threshold voltage of switching component 445-*a* and may add noise to the signal discharged from ferroelectric memory cell 105-*a* during a read operation. That is, when the actual threshold voltage of switching component 445-*a* varies from the expected threshold voltage, the charge sensed by sense component 125-*a* may be less than, or greater than, the charge actually transferred onto digit line 115-*b*, which may result in read errors.

According to the techniques described herein, the variation in voltage on digit line 115-*b* that is introduced by the non-ideal threshold voltage of switching component 445 may be compensated for by reducing the voltage of digit line 115-*b* to a non-zero value, as opposed to virtual ground, prior to a read operation. For example, the voltage on digit line 115-*b* may be reduced to a value that corresponds to the difference between the actual and ideal threshold voltage of switching component 445-*a* (e.g., the variation voltage). Thus, digit line 115-*b* is already at the variation voltage when the read operation begins, which means that the charge transferred during the read operation is an accurate representation of the charge stored at memory cell 105-*b*. That is, starting digit line 115-*b* at the variation voltage, as opposed to 0V, eliminates the extraneous transfer of charge that naturally occurs when the actual and expected threshold voltage of switching component 445-*a* are different and the circuit 400 attempts to reach an equilibrium state.

In some cases, the voltage on digit line 115-*b* may be reduced to the variation voltage by activating switch 440-*a*. Switch 440-*a* may be coupled between digit line 115-*b* and a voltage source, which in this case is virtual ground. In some examples, switch 440-*a* may be activated for a period of time associated with the threshold voltage of switching component 445. For example, switch 440-*a* may be activated until the voltage on digit line 115-*b* has a magnitude that is the variation in threshold voltage of switching component 445-*a*. In such cases, the variation in threshold voltage may be known. In some applications, memory cell 105-*b* may be isolated from digit line 115-*b* before reducing the voltage of digit line 115-*b*. For instance, selection component 220-*a* may be deactivated prior to activating switch 440-*a*.

In other examples, the voltage on digit line 115-*b* may be reduced by activating switching component 445-*a* instead of switch 440-*a*. For instance, the voltage may be reduced by establishing a conductive path between switching component 445-*a* and a voltage source that is at a lower potential than the voltage on digit line 115-*b*. For instance, switching component 445-*a* and switch 440-*b* may be activated so that the voltage on digit line 115-*b* is pulled down by voltage source VNEG 460 for a period of time associated with (e.g., close to but greater than) the threshold voltage of switching component 445-*a*. That is, VNEG 460 may be used to pull down the voltage of digit line 115-*b* until the voltage on digit line 115-*b* is slightly above the threshold voltage variation of switching component 445-*a*. Next, switch 440-*b* may be deactivated so that switching component 445-*a* finishes pulling the voltage of digit line 115-*b* all the way down to the threshold voltage variation value. Thus, switching component 445-*a* may be used to reduce the digit line voltage to the variation value, even when the variation value is unknown.

In some examples, the voltage on digit line 115-*b* may be reduced by activating both switching component 445-*a* and switch 440-*a*. That is, switch 440-*a* may be used to pull the digit line voltage down a portion of the way (e.g., to a value known to be greater than the variation voltage value) and switching component 445-*a* may be used to pull the digit line voltage down the rest of the way. For example, if the variation in threshold voltage of switching component 445-*a* is ΔVt, switch 440-*a* may be activated so that the voltage on digit line 115-*b* is pulled down to a threshold value that is greater than ΔVt (e.g., ΔVt+nV). Then, switching component 445-*a* may be activated so that the voltage on digit line 115—is reduced from (ΔVt+nV) to ΔVt. Using a combination of switch 440-*a* and switching component 445-*a* may decrease the time it takes for the digit line 115 voltage to be reduced to the variation value compared to using switching component 445-*a* alone. In some cases, switching component 445-*a* is activated in conjunction with switch 440-*b*.

Regardless of which voltage reduction technique is used, the voltage on digit line 115-*b* prior to a sense operation may be the variation in threshold voltage of switching component 445-*a*. By starting a sense operation with digit line 115-*b* already at the variation voltage, the full charge stored at capacitor 205-*a* may be transferred to sense capacitor 420, rather than using some to charge up digit line 115-*b*. During a sense operation, the voltage of sense capacitor 420 may be compared to a reference voltage. In some cases, comparing the voltage of sense capacitor 420 to the reference voltage includes activating sense component 125-*b*, which is in electronic communication with sense capacitor 420. In some cases, sense component 125-*b* is or includes a sense amplifier. The reference voltage may result from charging reference capacitor 425, which may be in electronic communication with sense component 125-*b*. Sense component 125-*b* may compare the voltage of sense capacitor 420 to the voltage of reference capacitor 425. In some cases, reference component 455 may be operated in a similar manner as the component associated with active memory cell 105-*b*. For instance, the voltage on digit line 115-*c* may be reduced to the variation voltage value associated with switching component 445-*b* prior to a sense operation.

Figure 5:
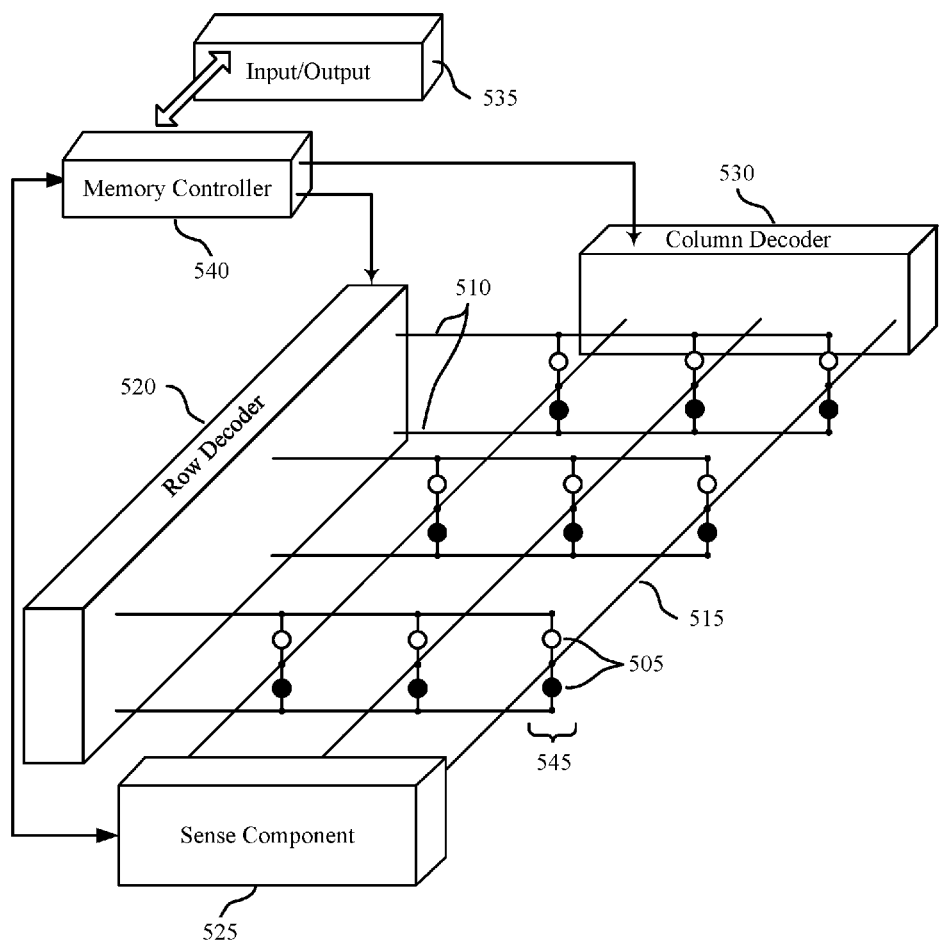
FIG. 5 illustrates an example memory array that supports compensation for threshold voltage variation in accordance with embodiments of the present disclosure.

FIG. 5 illustrates an example memory array 500 that supports compensation for threshold voltage variation in accordance with various embodiments of the present disclosure. Memory array 500 may also be referred to as an electronic memory apparatus. Memory array 500 includes memory cells 505 that are programmable to store different states. Each memory cell 505 may be programmable to store two states, denoted a logic 0 and a logic 1. In some cases, memory cell 505 is configured to store more than two logic states. A memory cell 505 may store charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, and as discussed above, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 505 are discussed below.

Memory array 500 may be a three-dimensional (3D) memory array, where 2D memory arrays are formed on top of one another. This may increase the number of memory cells that may formed on a single die or substrate as compared with 2D arrays, which in turn may reduce production costs or increase the performance of the memory array, or both. According to the example depicted in FIG. 5, memory array 500 includes two levels of memory cells 505 and may thus be considered a 3D memory array; however, the number of levels is not limited to two. Each level may be aligned or positioned so that memory cells 505 may be approximately aligned with one another across each level, forming a memory cell stack 545. Threshold variation for 3D memory arrays may be compensated for in a similar manner as 2D memory arrays.

Each row of memory cells 505 is connected to a word line 510, and each column of memory cells 505 is connected to a digit line 515. Word lines 510 and digit lines 515 may also be known as access lines. In some cases, a word line 510 may be referred to as a first access line and a digit line 515 may be referred to as a second access line. References to word lines and digit lines, or their analogues, are interchangeable without loss of understanding or operation. Word lines 510 and digit lines 515 may be substantially perpendicular to one another to create an array.

As shown in FIG. 5, the two memory cells 505 in a memory cell stack 545 may share a common conductive line such as a digit line 515. That is, a digit line 515 may be in electronic communication with the bottom electrode of the upper memory cell 505 and the top electrode of the lower memory cell 505. Other configurations may be possible, for example, a third layer may share a word line 510 with a lower layer. In general, one memory cell 505 may be located at the intersection of two conductive lines, or access lines, such as a word line 510 and a digit line 515. This intersection may be referred to as the address of the memory cell 505. A target memory cell 505 may be a memory cell 505 located at the intersection of an energized word line 510 and digit line 515; that is, a word line 510 and digit line 515 may be energized in order to read or write a memory cell 505 at their intersection. Other memory cells 505 that are in electronic communication with (e.g., connected to) the same word line 510 or digit line 515 may be referred to as untargeted memory cells 505.

As discussed above, electrodes may be coupled to a memory cell 505 and a word line 510 or a digit line 515. The term electrode may refer to an electrical conductor, and in some cases, may be employed as an electrical contact to a memory cell 505. An electrode may include a trace, wire, conductive line, conductive layer, or the like that provides a conductive path between elements or components of memory array 500.

Operations such as reading and writing may be performed on memory cells 505 by activating or selecting a word line 510 and digit line 515, which may include applying a voltage or a current to the respective line. Word lines 510 and digit lines 515 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Accessing memory cells 505 may be controlled through a row decoder 520 and a column decoder 530. For example, a row decoder 520 may receive a row address from the memory controller 540 and activate the appropriate word line 510 based on the received row address. Similarly, a column decoder 530 receives a column address from the memory controller 540 and activates the appropriate digit line 515. Thus, by activating a word line 510 and a digit line 515, a memory cell 505 may be accessed. As described herein, the voltage on a word line 510 may be reduced to a non-zero threshold value prior to a read operation.

During a read operation, a memory cell 505 may be sensed by sense component 525 to determine the stored state of the memory cell 505. For example, after accessing the memory cell 505, the ferroelectric capacitor of memory cell 505 may discharge onto its corresponding digit line 515. Discharging the ferroelectric capacitor may result from biasing, or applying a voltage, to the ferroelectric capacitor. The discharging may cause a change in the voltage of the digit line 515, which sense component 525 may compare to a reference voltage (not shown) in order to determine the stored state of the memory cell 505. For example, if digit line 515 has a higher voltage than the reference voltage, then sense component 525 may determine that the stored state in memory cell 505 was a logic 1 and vice versa.

According to the techniques described herein, a memory cell 505 may discharge onto a digit line 515 that has a voltage value associated with a threshold voltage of a component involved in the read operation. Sense component 525 may include various transistors or amplifiers in order to detect and amplify a difference in the signals, which may be referred to as latching. In some cases, sense component 525 is an integrator, or current sink. The logic state of memory cell 505 detected at sense component 525 may be output through column decoder 530 as input/output 535. In some cases, sense component 525 may be a part of column decoder 530 or row decoder 520. Or, sense component 525 may be connected to or in electronic communication with column decoder 530 or row decoder 520.

A memory cell 505 may be set, or written, by similarly activating the relevant word line 510 and digit line 515—i.e., a logic value may be stored in the memory cell 505. Column decoder 530 or row decoder 520 may accept data, for example input/output 535, to be written to the memory cells 505. A ferroelectric memory cell 505 may be written by applying a voltage across the ferroelectric capacitor.

The memory controller 540 may control the operation (read, write, re-write, refresh, discharge, etc.) of memory cells 505 through the various components, for example, row decoder 520, column decoder 530, and sense component 525. In some cases, one or more of the row decoder 520, column decoder 530, and sense component 525 may be co-located with the memory controller 540. Memory controller 540 may generate row and column address signals in order to activate the desired word line 510 and digit line 515. Memory controller 540 may also generate and control various voltages or currents used during the operation of memory array 500. For example, it may apply discharge voltages to a word line 510 or digit line 515 after accessing one or more memory cells 505. In general, the amplitude, shape, or duration of an applied voltage or current discussed herein may be adjusted or varied and may be different for the various operations discussed in operating memory array 500. Furthermore, one, multiple, or all memory cells 505 within memory array 500 may be accessed simultaneously; for example, multiple or all cells of memory array 500 may be accessed simultaneously during a reset operation in which all memory cells 505, or a group of memory cells 505, are set to a single logic state.

Figure 6:
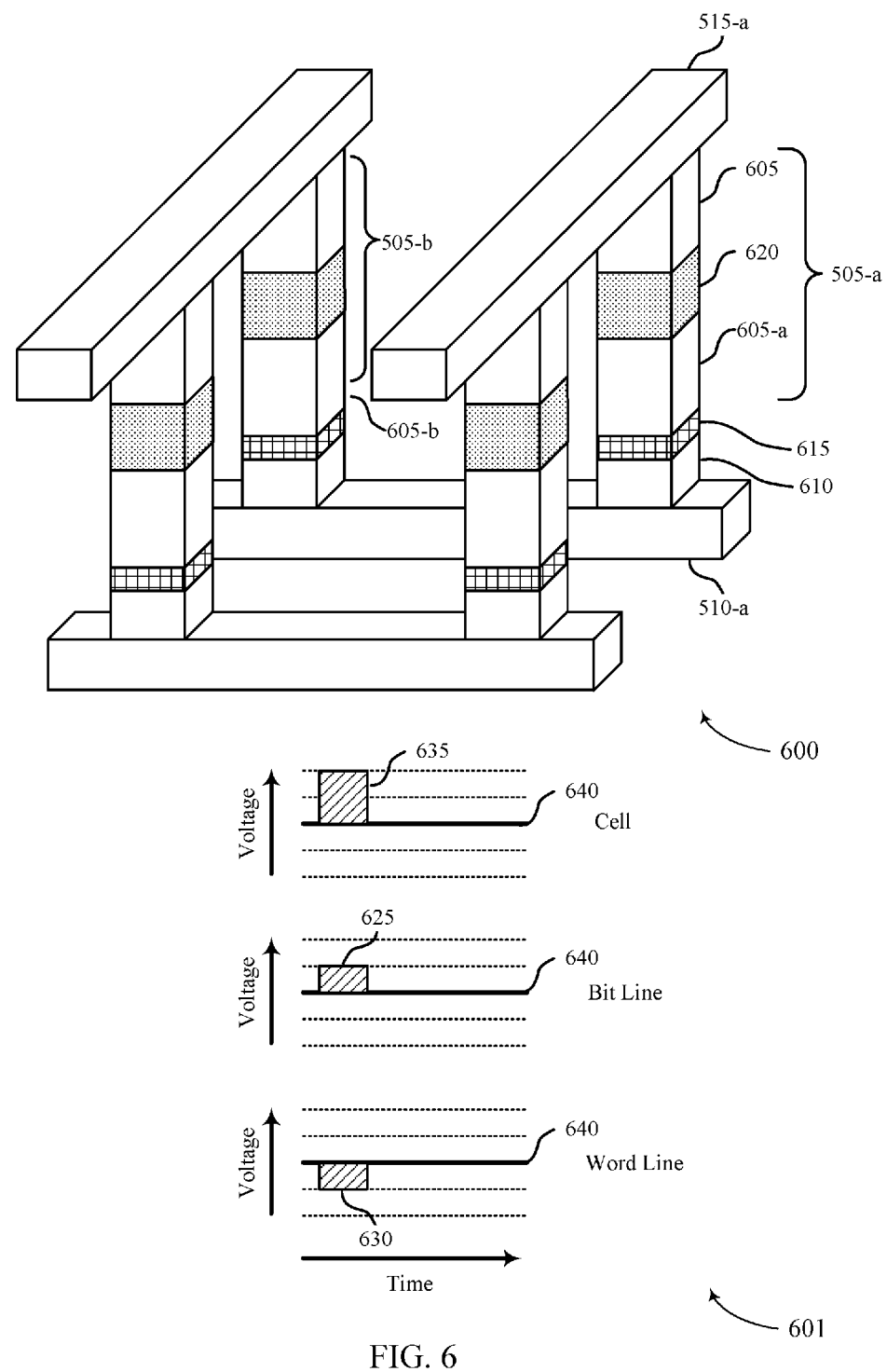
FIG. 6 illustrates an example memory and an example voltage plot that supports reading and writing non-volatile memory cells and compensation for threshold voltage variation in accordance with embodiments of the present disclosure.

FIG. 6 illustrates an example memory array 600 and an example voltage plot 601 that supports reading and writing non-volatile memory cells and compensation for threshold voltage variation in accordance with various embodiments of the present disclosure. Memory array 600 may be an example of memory array 600 with reference to FIG. 5. Memory array 600 includes memory cell 505-a, memory cell 505-b, word line 510-a, and digit line 515-a, which may be examples of a memory cell 505, word line 510, and digit line 515, as described with reference to FIG. 5. Memory cell 105-a includes electrode 605, electrode 605-a, and memory element 620, which may be a ferroelectric material. Memory cell 505-b includes electrode 605-b. Electrode 605-a of memory cell 505-a and electrode 605-b of memory cell 505-b may be referred to as middle electrodes 605-a and 605-b. Memory array 600 also includes bottom electrode 610 and selection component 615. In some cases, a 3D memory array may be formed by stacking multiple memory arrays 600 on one another. The two stacked arrays may, in some examples, have common conductive lines such that each level may share word lines 510 or digit lines 515 as described with reference to FIG. 5. Memory cell 505-a may be a target memory cell.

Memory array 600 may be referred to as a cross-point architecture. It may also be referred to as a pillar structure. For example, as shown in FIG. 6, a pillar may be in contact with a first conductive line (word line 510-a) and a second conductive line (digit line 515-a), where the pillar comprises a first electrode (bottom electrode 610), selection component 615, and ferroelectric memory cell 505-a, where ferroelectric memory cell 505-a includes a second electrode (electrode 605-a) ferroelectric memory element 620, and a third electrode (electrode 605). In some cases, electrode 605-a may be referred to as a middle electrode.

The cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F$^2$ memory cell area, where F is the smallest feature size, compared to other architectures with a 6F$^2$ memory cell area, such as those with a three-terminal selection. For example, DRAM may use a transistor, which is a three-terminal device, as the selection component for each memory cell and may have a larger memory cell area compared to the pillar architecture.

Voltage plot 601 depicts voltages applied as a function of time during an access operation of a target memory cell 505. Prior to accessing a memory cell, such as memory cell 505-a, both the word line 510-a and digit line 515-a may be maintained at an inhibit voltage 640—i.e., a voltage that prevents discharging of the memory cell 505-a. For instance, both the word line 510-a and digit line 515-a may be maintained at an inhibit voltage 640 that is equivalent to a virtual ground. To access memory cell 505-a, both the word line 510-a and digit line 515-a may be energized by applying a voltage to them. That is, digit line access voltage 625 may be applied at the same time as word line access voltage 630. In some cases, the voltages applied to the word line 510-a and digit line 515-a have opposite polarities and may be additive, and the resulting voltage applied to target memory cell 505-a is cell access voltage 635. That is, in plot 601, digit line access voltage 625 has a positive polarity and word line access voltage 630 has a negative polarity, and the net sum across memory cell 505-a is cell access voltage 635. In other examples, cell access voltage 635 may be obtained by positively biasing or negatively biasing only one of digit line access voltage 625 and word line access voltage 630.

In some examples, the inhibit voltage 640 may be an intermediary voltage, for example a mid-bias voltage. That is, instead of applying a positive digit line access voltage 625 and a negative word line access voltage 630 relative to a virtual ground, the digit line access voltage 625 and the negative word line access voltage 630 may be applied relative to an intermediary voltage. For instance, the memory array may be operated using only a positive voltage source and the magnitude of the intermediary voltage is between the magnitude of the positive voltage source and a virtual ground. In some examples, both digit line access voltage 625 and word line access voltage 630 are maintained at the intermediary voltage prior to an access operation of memory cell 505-a. And during an access operation, digit line access voltage 625 may be increased (e.g., to a positive supply rail) while word line access voltage 630 may be simultaneously decreased (e.g., to a virtual ground), generating a net voltage across memory cell 505-a.

Selection component 615 may, in some cases, be connected in series between a memory cell 505 and a conductive line, for example, between memory cell 105-a and at least one of word line 110-a or digit line 115-a. For example, as depicted in FIG. 6, selection component 615 may be located between electrode 605-a and bottom electrode 610; thus, selection component 615 is located in series between memory cell 505-a and word line 510-a. Other configurations are possible. For example, selection component may be located in series between memory cell 505-a and digit line 515-a. The selection component may aid in selecting a particular memory cell 505-a or may help prevent stray currents from flowing through non-selected memory cells 505-a adjacent a selected memory cell 505-a. It may also reduce the bias across untargeted memory cells, such as memory cell 505-b. For example, selection component 615 may have a threshold voltage such that a current flows through selection component 615 when the threshold voltage is met or exceeded.

Selection component 615 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal select device such as a diode. In some cases, selection component 615 is a chalcogenide film, for example, an alloy of selenium (Se), arsenic (As), and germanium (Ge). Selection component 615 may be separated from memory element 620 by middle electrode 605-a. As such, middle electrode 605-a may electrically float—that is, charge may accumulate because it may not be directly connected to an electrical ground or a component capable of being electrically grounded.

Memory array 600 may be made by various combinations of material formation and removal. For example, layers of material may be deposited that correspond to the word line 510-a, bottom electrode 610, selection component 615, electrode 605-a, memory element 620, and electrode 605. Material may be selectively removed to then create the desired features, such as the pillar structure depicted in FIG. 6. For example, features may be defined using photolithography to pattern a photoresist and then material may be removed by techniques such as etching. Digit lines 515-a may then be formed, for example, by depositing a layer of material and selectively etching to form the line structure depicted in FIG. 6. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of memory array 600. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

FIG. 7 illustrates an example of a circuit 700 that supports compensation for threshold voltage variation. Circuit 700 may be part of a 3D memory array as described with reference to FIG. 5. Circuit 700 may include a memory cell 505-b, a load capacitor 710, and an integrator 715. In some cases, integrator 715 may be referred to as a switching component. Memory cell 505-b may include a selection component 705 and a capacitor 725 (e.g., a ferroelectric capacitor). Selection component 705 may be a two terminal device, as shown, or a three terminal device. Circuit 700 may be accessed via two access lines: a first access line 720-a, which may be an example of a word line 510, and second access line 720-b, which may be an example of a digit line 515.

The first access line 720-a may provide a conductive path between memory cell 505-b and integrator 715 (e.g., memory cell 505-b may be in electronic communication with integrator 715 via first access line 720-a). First access line 720-a may also provide a conductive path between memory cell 505-b, load capacitor 710, and integrator 715. Voltage may be applied to memory cell 505-b via second access line 720-b (e.g., second access line 720-b may provide a conductive path between memory cell 505-b and a voltage source). In some cases, circuit 700 includes pull down device 735. Pull down device 735 may be a component or combination components capable of reducing the voltage on first access line 720-a (e.g., pull down device 735 may be a switch coupled to a voltage source). Pull down device 735 may be in electronic communication with first access line via conductive line 730, and, when activated, may reduce the voltage on first access line 720-a.

Memory cell 505-b may be written to a logic state as described with reference to FIG. 7. To read the logic state, voltage may be applied across the memory cell 505-b (e.g., via second access line 720-b) so that charge from capacitor 725 transfers to load capacitor 710 (e.g., via first access line 720-a). In one example, applying the voltage across memory cell 505-b may include activating selection component 705, which in turn may establish a conductive path between the memory cell 505-a and load capacitor 725. As load capacitor 725 charges, the voltage on first access line 720-a may increase. Once the voltage of first access line 720-a reaches a certain value (referred to herein as the trigger value) and after the selection component 705 is activated, integrator 715 may start to pull current. For example, integrator 715 may pull current for discrete chunks of time that correspond to a particular amount of charge. In an ideal scenario, first access line 720-a is pre-charged, or initialized, to 0V prior to the read operation and, once activated, integrator 715 continues to sink current until first access line 720-a is completely discharged. Thus, the entire charge stored at capacitor 725 is transferred to first access line 720-a, and the amount of this charge can be determined by counting the number of times integrator 715 pulls charge.

The amount of charge pulled by integrator 715 can be compared to a reference charge, the result of which may determine which logic state was stored at the capacitor 725. In some cases, the charge may be converted into another form (e.g., voltage) for comparison. In some examples, the period of time the integrator 715 is active (e.g., pulling current) may be determined. For example, the time the integrator 715 is active may be determined by multiplying the number of times the integrator 715 pulls current by the amount of time each current pull takes. In such cases, the stored state of memory cell 505-b may be determined based on the period of time the integrator 715 is active. In some applications, the integrator 715 may be deactivated upon the determination that first access line 720-a has reached a threshold value (e.g., a value below the trigger value).

Integrator 715 may have an associated threshold voltage below which integrator 715 is deactivated. If, as described above, first access line 720-a is pre-charged to 0V prior to a sense operation, some of the polarization charge stored at capacitor 725 may be lost in order to charge up first access line 720-a to the threshold value (e.g., to activate integrator 715). That is, signal from capacitor 725 that charges first access line 720-a from 0V to the threshold voltage may remain on first access line 720-a, as opposed to getting pulled by integrator 715 because integrator 715 stops sinking charge once first access line 720-a drops below the threshold voltage (e.g., the voltage remaining on first access line 720-a may not be sufficient to trigger integrator 715). Thus, the signal that is ultimately sensed may be a portion of the signal originally stored at capacitor 725. Because the threshold voltage for different integrators may vary, the voltage left on first access line 720-a may also vary. Variations in voltage on first access line 720-a may introduce noise into the read signal, which in turn may decreased read accuracy.

According to the techniques described herein, voltage on first access line 720-a may be reduced to a threshold value (e.g., the threshold voltage of integrator 715) that is greater than 0V. The voltage may be reduced so that when a sense operation is commenced, the voltage initially on first access line 720-a is already the threshold voltage of integrator 715. That way, no charge from capacitor 725 is lost to charging up first access line to activate integrator 715. Instead, all of the signal discharged by capacitor 725 is pulled by current pulled by integrator 715. Thus, the signal captured by integrator 715 is representative of the signal originally stored by capacitor 725.

The voltage on first access line 720-a may be reduced by establishing a conductive path between first access line 720-a and a voltage source that is at a lower voltage potential. For instance, the voltage on first access line 720-a may be reduced to the threshold voltage of integrator 715 using (e.g., by activating) pull down device 735 or integrator 715, or both. In some cases, (e.g., when the threshold voltage of integrator 715 is known), pull down device 735 may be activated until the voltage on first access line 720-a is reduced to the threshold voltage. Alternatively, integrator 715 may be used to reduce the voltage on first access line 720-a to the threshold voltage. In another example, a combination of pull down device 735 and integrator 715 is used to reduce the voltage on first access line 720-a. For instance, pull down device 735 may reduce the voltage on first access line 720-a to a value that is xV above the threshold voltage and then integrator 715 may finish reducing the voltage to the threshold voltage.

FIG. 8 illustrates an example of a timing diagram 800 that supports compensation for threshold voltage variation in accordance with various embodiments of the present disclosure. Timing diagram 800 includes voltage represented on axis 805 and time represented on axis 810, and timing diagram 800 depicts an exemplary sense operation of circuit 700. The voltages applied to various components of circuit 700 are represented as a function of time on timing diagram 800. For example, timing diagram 800 includes first access line voltage 815, second access line voltage 820, selection component voltage 825, and capacitor voltage 830. First access line voltage 815-*a* represents voltage on first access line 720-*a* that corresponds to a logic 0 and first access line voltage 815-*b* represents voltage on first access line 720-*a* that corresponds to a logic 1. Second access line voltage 820 may represent voltage on second access line 720-*b*. First access line voltage 855 may represent the voltage on first access line 720-*a* that is seen by integrator 715 minus the threshold voltage of integrator 715. Selection component voltage 825 may represent the voltage at an internal node of memory cell 505-*b* (e.g., the voltage at a middle electrode of memory cell 505) and capacitor voltage 830 may represent the voltage across the capacitor 725.

At 835, first access line voltage 815 may be reduced to a predetermined value. The predetermined value may be the threshold voltage of the integrator 715, or above the threshold voltage by a threshold amount. In some cases, first access line voltage 815 may be reduced using only the integrator 715. In such cases, the integrator 715 may reduce first access first line voltage 815 all the way to the threshold voltage. In other cases, first access line voltage 815 may be reduced using a combination of the integrator 715 and pull down device 735. For example, pull down device 735 may reduce first access line voltage 815 to a level that is above the integrator threshold voltage by a threshold amount. Then, the integrator 715 may be used to reduce first access line voltage 815 to threshold voltage of the integrator 715. In other cases, only the pull down device 735 may be used to reduce first access line voltage 815. In such cases, the pull down device 735 may be activated until the first access line voltage 815 is at the value of the integrator threshold voltage.

Regardless of which combination of components is used to reduce the first access line voltage 815, at 840 the circuit 700 may be controlled so that the first access line voltage 815 settles to a static or equilibrium state (e.g., first access line 720-*a* may be isolated from any voltage sources). Between 845 and 850, the second access line voltage 820 may be increased until memory cell 505-*b* is turned on (e.g., until memory cell 505-*b* starts to discharge onto first access line 720-*a*. After 850, first access line voltage 855 may exhibit a saw-tooth pattern as charge from capacitor 725 is transferred to first access line 720-*a* and removed by integrator 715 (e.g., in quantized time steps). Integrator 715 may continue to pull charge from first access line 720-*a* (e.g., from load capacitor 710) until first access line voltage 855 drops below the threshold value of the integrator 715. The number of times the integrator 715 is activated (e.g., pulls or sinks charge) may be used to determine the logic state stored by memory cell 505-*b*.

Figure 9:
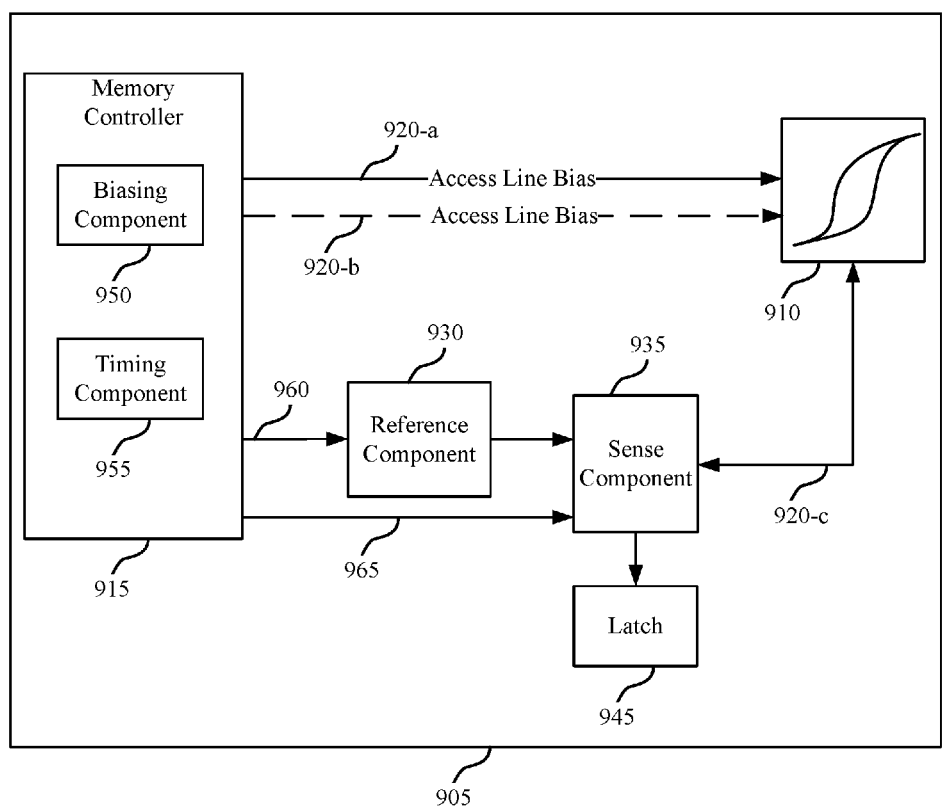
FIG. 9 illustrates a block diagram of a device that supports compensation for threshold voltage variation in accordance with embodiments of the present disclosure.

FIG. 9 shows a block diagram 900 of a device 905 that supports compensating for variations in threshold voltages of selection components in accordance with various embodiments of the present disclosure. Device 905 may be referred to as an electronic memory apparatus, and may be an example of a component of a memory array 100 as described with reference to FIG. 1.

Device 905 may include one or more memory cells 910, a memory controller 915, a reference component 930, a sense component 935, and a latch 945. Device 905 may also include a number of access lines 920. For example, if memory cells 910 are part of a 3D memory array, device 905 may include an access line 920-*a*, which may be an example of a digit line 515, and an access line 920-*c*, which may be an example of a word line 510. If memory cells 910 are part of a 2D memory array, device 905 may include an access line 920-*a*, which may be an example of a word line 110, access line 920-*b*, which may be an example of a plate line 210, and access line 920-*c*, which may be an example of a digit line 115. The components of device 905 may be in electronic communication with each other and may perform one or more of the functions described herein. In some cases, memory controller 915 may include biasing component 950 and timing component 955. Memory controller 915 may be an example of aspects of the memory controller 1015 and memory controller 1115 described with reference to FIGS. 10 and 11.

Memory controller 915 may be in electronic communication with access line 920-*a*, access line 920-*c*, and sense component 935. In some cases, memory controller 915 is also in electronic communication with access line 920-*b*. Device 905 may also include reference component 930 and latch 945. The components of device 905 may be in electronic communication with each other and may perform embodiments of the functions described with reference to FIGS. 1 through 8. In some cases, reference component 930, sense component 935, and latch 945 may be components of memory controller 915.

In some examples, access line 920-*c* is in electronic communication with sense component 935 and one or more ferroelectric capacitor(s) of ferroelectric memory cells 910. A ferroelectric memory cell 910 may be writable with a logic state (e.g., a first or second logic state). Access line 920-*a* may be in electronic communication with memory controller 915 and a selection component of ferroelectric memory cell 910. Sense component 935 may be in electronic communication with memory controller 915, access line 920-*c*, latch 945, and reference line 960. Reference component 930 may be in electronic communication with memory controller 915 and reference line 960. Sense control line 965 may be in electronic communication with sense component 935 and memory controller 915. These components may also be in electronic communication with other components, both inside and outside of device 905, in addition to components not listed above, via other components, connections, or busses.

Memory controller 915 may be configured to activate one or more access lines 920 by applying voltages to those various nodes. For example, biasing component 950 may be configured to apply a voltage to operate memory cells 910 to read or write memory cells 910 as described above. In some cases, memory controller 915 may include a row decoder, column decoder, or both, as described with reference to FIGS. 1 and 5. This may enable memory controller 915 to access one or more memory cells 910. Biasing component 950 may also provide or apply voltage to reference component 930 in order to generate a reference signal for sense component 935. Additionally, biasing component 950 may provide or apply voltage for the operation of sense component 935.

In some cases, memory controller 915 may perform its operations using timing component 955. For example, timing component 955 may control the timing of the various access line selections or biasing, including timing for switching and voltage application to perform the memory functions, such as reading and writing, discussed herein. In some cases, timing component 950 may control the operations of biasing component 950.

Reference component 930 may include various components to generate a reference signal for sense component 935. Reference component 930 may include circuitry configured to produce a reference signal. In some cases, reference component 930 may be implemented using ferroelectric memory cells. Sense component 935 may compare a signal from memory cell 910 (through access line 920-c) with a reference signal from reference component 930. In some cases, sense component 935 is an integrator such as described with reference to FIG. 7. Upon determining the logic state, the sense component 935 may store the output in latch 945, where it may be used in accordance with the operations of an electronic device that device 905 is a part. Sense component 935 may include a sense amplifier in electronic communication with the latch and the ferroelectric memory cell.

Memory controller 915, in combination with other components of device 905, may identify a ferroelectric memory cell of memory cells 910 for a read operation. The memory cell may be in electronic communication with a switching component via access line 920-c, and the memory cell may be in electronic communication with a voltage source via access line 920-a. For example, when the memory cell is part of a 2D memory array and access line 920-c is an example of a digit line 115, access line 920-c may provide a conductive path between the memory cell and a switching component 445-a such as described with reference to FIG. 4. In such cases, access line 920-a may be an example of a word line 110 and may provide a conductive path for the memory cell to be in electronic communication with a voltage source. When the memory cell is part of a 3D memory array and access line 920-c is an example of a word line 510 (or first access line 720-a), access line 920-c may provide a conductive path between the memory cell and an integrator 715 such as described with reference to FIG. 7. In such cases, access line 920-a may be an example of a digit line 515 (or second access line 720-b) and may provide a conductive path for the memory cell to be in electronic communication with a voltage source.

After identification of the memory cell, memory controller 915 may reduce the voltage of access line 920-c to a value that is based on a threshold value of the switching component. The voltage reduction may be based on the identification of the memory cell. In some cases, memory controller 915 may activate the switching component (e.g., switching component 445-a or integrator 715), which may be coupled to a voltage source. In such cases, the voltage reduction may be based on activating the switching component. In some examples, memory controller 915 activates an additional switching component (e.g., switch 440-a or pull down device 735). In such cases, the voltage reduction may be based on activating the additional switching component. In some cases, memory controller 915 may activate the additional switching component to reduce the voltage on access line 920-c to a threshold value before activating the switching component to reduce the voltage from the threshold value to the value. After reducing the voltage of access line 920-c, memory controller 915 may trigger a read operation of the memory cell In some cases, memory controller 915 applies a voltage to access line 920-a to activation a selection component (e.g., selection component 220-a or selection component 705) of the memory cell. In such cases, the memory controller 915 may apply a voltage to activate the switching component (e.g., switching component 445-a) after applying voltage to access line 920-a.

Figure 10:
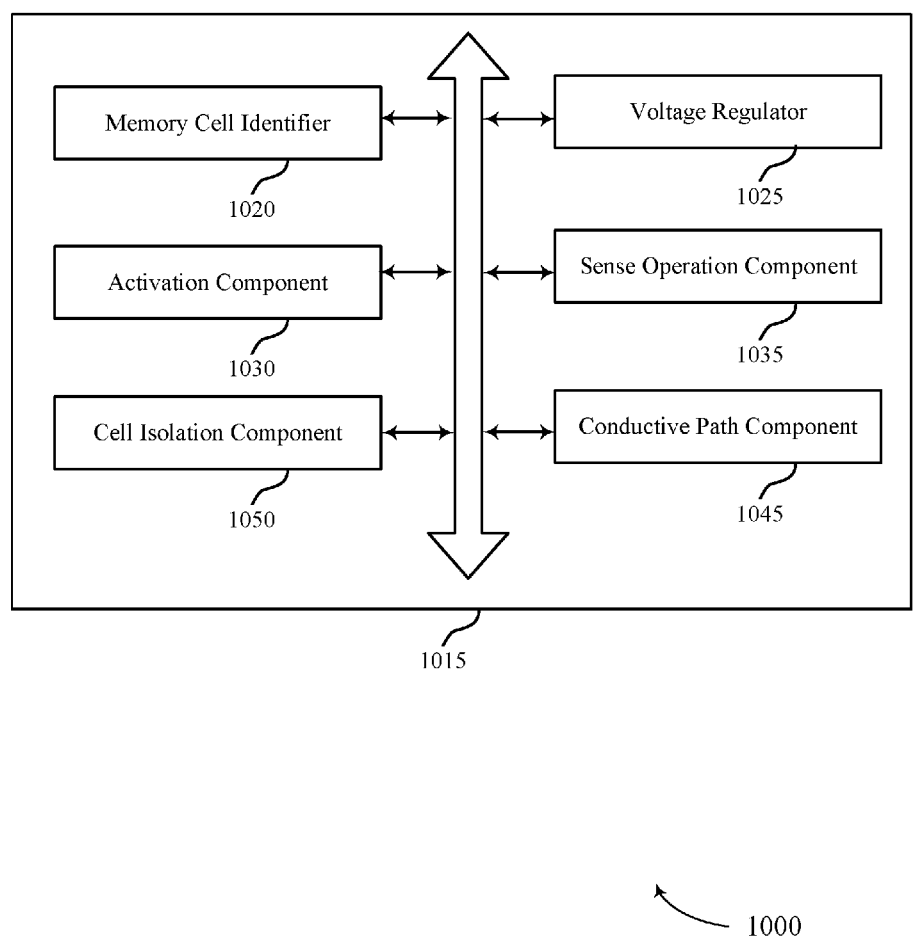
FIG. 10 shows a block diagram of a memory controller that supports compensation for threshold voltage variation in accordance with embodiments of the present disclosure.

FIG. 10 shows a block diagram 1000 of a memory controller 1015 that supports compensation for threshold voltage variation in accordance with various embodiments of the present disclosure. The memory controller 1015 may be an example of aspects of a memory controller 915 described with reference to FIG. 9, and a memory controller 1115 described with reference to FIG. 11. The memory controller 1015 may include memory cell identifier 1020, voltage regulator 1025, activation component 1030, sense operation component 1035, conductive path component 1045, and cell isolation component 1050. Each of these modules may communicate, directly or indirectly, with one another (e.g., via one or more buses). In some cases, one or more of these modules is part of a biasing component 950 or timing component 955 described with reference to FIG. 9. The various components of memory controller 1015 may be software or firmware modules in some examples.

The components of memory controller 1015 may facilitate the implementation of techniques described herein for 2D and 3D memory arrays. For 2D memory arrays, memory cell identifier 1020 may identify a ferroelectric memory cell for a read operation, where an access line (e.g., digit line) of the ferroelectric memory cell is in electronic communication with a sense component (e.g., sense component 125-b) via a switching component (e.g., switching component 445-a).

Voltage regulator 1025 may cause reduction of a voltage of the access line to a value that is based at least in part on a threshold voltage of the switching component. For example, voltage regulator 1025 may cause the reduction by triggering various components, such as signal generators and switches, to apply control voltages in the manner described herein. The voltage of the access line may be reduced based at least in part on identifying the ferroelectric memory cell for the read operation. In some cases, the ferroelectric memory cell may be isolated from the access line before reducing the voltage of the access line (e.g., via cell isolation component 1050). Isolating the ferroelectric memory cell may include deactivating a selection component (e.g., selection component 220-a) of the ferroelectric memory cell.

Activation component 1030 may activate the switching component after the voltage of the access line reaches the value (e.g., by activating one or more signal generators and complementary switches). Activation component 1030 may operate in combination with other components of memory controller 1015, such as conductive path component 1045 and voltage regulator 1025, to reduce the voltage on the access line. For example, in some cases, reducing the voltage of the access line includes activating an additional switching component (e.g., switch 440-a) coupled between the access line and a voltage source (e.g., ground) for a predetermined period of time.

In other cases, reducing the voltage of the access line may include establishing a conductive path between the switching component and a voltage source (e.g., via conductive path component 1045) and activating the switching component for a period of time while the conductive path is established. In some cases, reducing the voltage on the access line includes activating the additional switching component coupled with the access line and a first voltage source and activating the switching component while a conductive path is established between the switching component and a second voltage source.

Sense operation component 1035 may facilitate, in cooperation with the sense component, performance of the read operation at the sense component of the ferroelectric memory cell after the switching component is activated.

For 3D memory arrays, memory cell identifier 1020 may identify a ferroelectric memory cell for a read operation, where a selection component of the ferroelectric memory cell is in electronic communication with an integrator via a first access line (e.g., word line).

Voltage regulator 1025 may reduce a voltage of the first access line to a value that is based on a threshold voltage of the integrator. The voltage of the first access line may be reduced based on identifying the ferroelectric memory cell for the read operation. In some cases, voltage regulator 1025 may operation in combination with other components of memory controller 1015, such as conductive path component 1045, to reduce the voltage of the first access line. For example, reducing the voltage of the first access line may include establishing a conductive path between the first access line and a voltage source via activation of a switching component (e.g., pull down device 735) by, for instance, operating or applying a voltage to operation the switching component. In other cases, reducing the voltage of the first access line may include establishing a conductive path between the first access line and a voltage source via activation of the integrator by operating a switching component. In yet another example, reducing the voltage of the first access line may include establishing a conductive path between the first access line and the first voltage source via activation of the switching component and establishing a conductive path between the first access line and a second voltage source via activation of the integrator.

Activation component 1030 may apply a voltage to a second access line (e.g., e.g., digit line) of the ferroelectric memory cell after the voltage of the first access line reaches the value. For example, activation component 1030 may operate a switching component, which may cause a voltage to be applied to a selection component. Application of the voltage may activate the selection component. In some cases, activating the selection component establishes a conductive path between the ferroelectric memory cell and a sense capacitor (e.g., load capacitor 710). In some cases, applying the voltage to the second access line transfers charge from the ferroelectric memory cell to the sense capacitor. Activation component 1030 may also activate the integrator for the read operation after the selection component is activated. In some examples, activation of the integrator transfers current from the sense capacitor. In some cases, activation component 1030 may determine that the first access line has reached a threshold value and deactivate the integrator based at least in part on the determination. Activation component 1030 may, in some cases, determine a period of time the integrator is active and determine a stored state of the ferroelectric memory cell based at least in part on a value of the period of time.

In some cases, memory cell identifier 1020 may identify a ferroelectric memory cell for a read operation, where the ferroelectric memory cell is in electronic communication with a switching component (e.g., switching component 445-*a* in the 2D case or integrator 715 in the 3D case) via a first access line (e.g., digit line 115 in the 2D case or word line 510 in the 3D case). Voltage regulator 1025 may reduce a voltage of the first access line to a value that is based at least in part on a threshold voltage of the switching component. The voltage of the first access line may be reduced based at least in part on identifying the ferroelectric memory cell for the read operation.

Activation component 1030 may apply a voltage to a second access line (e.g., word line 110 in the 2D case and digit line 515 in the 3D case) for ferroelectric memory cell after the voltage of the first access line reaches the value. In some cases, activation component 1030 may operate in combination with other components of memory controller 1015, such as voltage regulator 1025 or conductive path component 1045, to reduce the voltage of the first access line. For example, reducing the voltage of the first access line may include establishing a conductive path between the first access line and a voltage source (e.g., ground or a negative voltage source such as VNEG). Establishing the conductive path may include activating an additional switching component (e.g., switch 440-*a* for the 2D case or pull down device 735 for the 3D case) coupled with the first access line and a voltage source. In other cases, establishing the conductive path includes activating the switching component (e.g. switching component 445-*a* for the 2D case or integrator 715 for the 3D case) coupled with the first access line and a voltage source.

Sense operation component 1035 may facilitate performance of the read operation of the ferroelectric memory cell after application of the voltage to the second access line. In some cases, performing the read operation includes applying a voltage to the ferroelectric memory cell that transfers charge from the ferroelectric memory cell to a sense capacitor (e.g., sense capacitor 420 for the 2D case or load capacitor 710 for the 3D case) in electronic communication with a sensing circuit (e.g., sense component 125-*b*).

Figure 11:
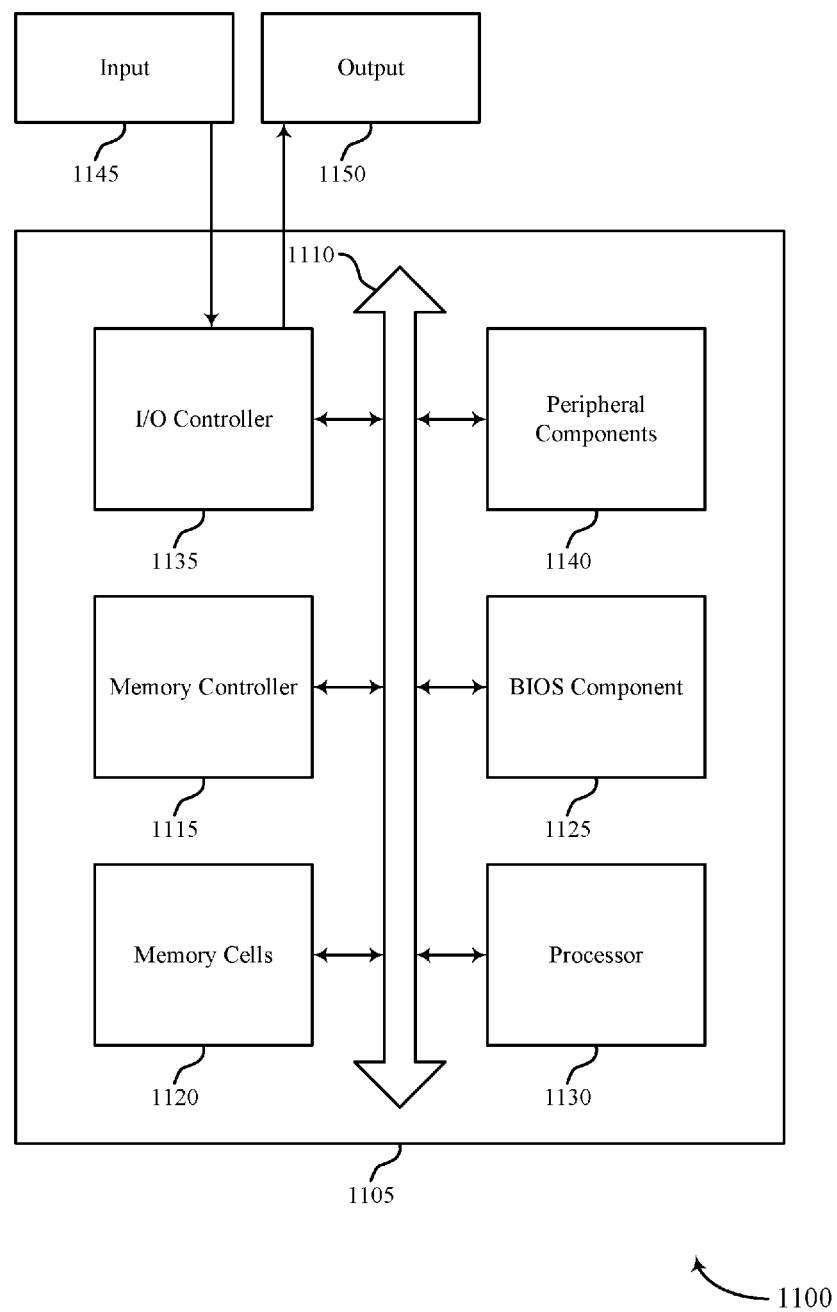
FIG. 11 shows a block diagram of a system with a device that supports compensation for threshold voltage variation in accordance with embodiments of the present disclosure.

FIG. 11 shows a diagram of a system 1100 including a device 1105 that supports compensation for threshold voltage variation in accordance with various embodiments of the present disclosure. Device 1105 may be include the components of device 905 as described above, e.g., with reference to FIG. 9. Device 1105 may include components for bi-directional voice and data communications including components for transmitting and receiving communications, including memory controller 1115, memory cells 1120, basic input/output system (BIOS) component 1125, processor 1130, I/O controller 1135, and peripheral components 1140. These components may be in electronic communication via one or more busses (e.g., bus 1110).

Memory cells 1120 may store information (i.e., in the form of a logical state) as described herein. BIOS component 1125 be a software component that includes BIOS operated as firmware, which may initialize and run various hardware components. BIOS component 1125 may also manage data flow between a processor and various other components, e.g., peripheral components, input/output control component, etc. BIOS component 1125 may include a program or software stored in read only memory (ROM), flash memory, or any other non-volatile memory.

Processor 1130 may include an intelligent hardware device, (e.g., a general-purpose processor, a digital signal processor (DSP), a central processing unit (CPU), a microcontroller, an application-specific integrated circuit (ASIC), an field-programmable gate array (FPGA), a programmable logic device, a discrete gate or transistor logic component, a discrete hardware component, or any combination thereof). In some cases, processor 1130 may be configured to operate a memory array using a memory controller. In other cases, a memory controller may be integrated into processor 1130. Processor 1130 may be configured to execute computer-readable instructions stored in a memory to perform various functions (e.g., functions or tasks supporting compensation for threshold voltage variation).

I/O controller 1135 may manage input and output signals for device 1105. I/O controller 1135 may also manage peripherals not integrated into device 1105. In some cases, I/O controller 1135 may represent a physical connection or port to an external peripheral. In some cases, I/O controller 1135 may utilize an operating system such as iOS®, ANDROID®, MS-DOS®, MS-WINDOWS®, OS/2®, UNIX®, LINUX®, or another known operating system.

Peripheral components 1140 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 1145 may represent a device or signal external to device 1105 that provides input to device 1105 or its components. This may include a user interface or an interface with or between other devices. In some cases, input 1145 may be managed by I/O controller 1135, and may interact with device 1105 via a peripheral component 1140.

Output 1150 may also represent a device or signal external to device 1105 configured to receive output from device 1105 or any of its components. Examples of output 1150 may include a display, audio speakers, a printing device, another processor or printed circuit board, etc. In some cases, output 1150 may be a peripheral element that interfaces with device 1105 via peripheral component(s) 1140. In some cases, output 1150 may be managed by I/O controller 1135

The components of device 1105 may include circuitry designed to carry out their functions. This may include various circuit elements, for example, conductive lines, transistors, capacitors, inductors, resistors, amplifiers, or other active or inactive elements, configured to carry out the functions described herein. Device 1105 may be a computer, a server, a laptop computer, a notebook computer, a tablet computer, a mobile phone, a wearable electronic device, a personal electronic device, or the like. Or device 1105 may be a portion or component of such a device.

Figure 12:
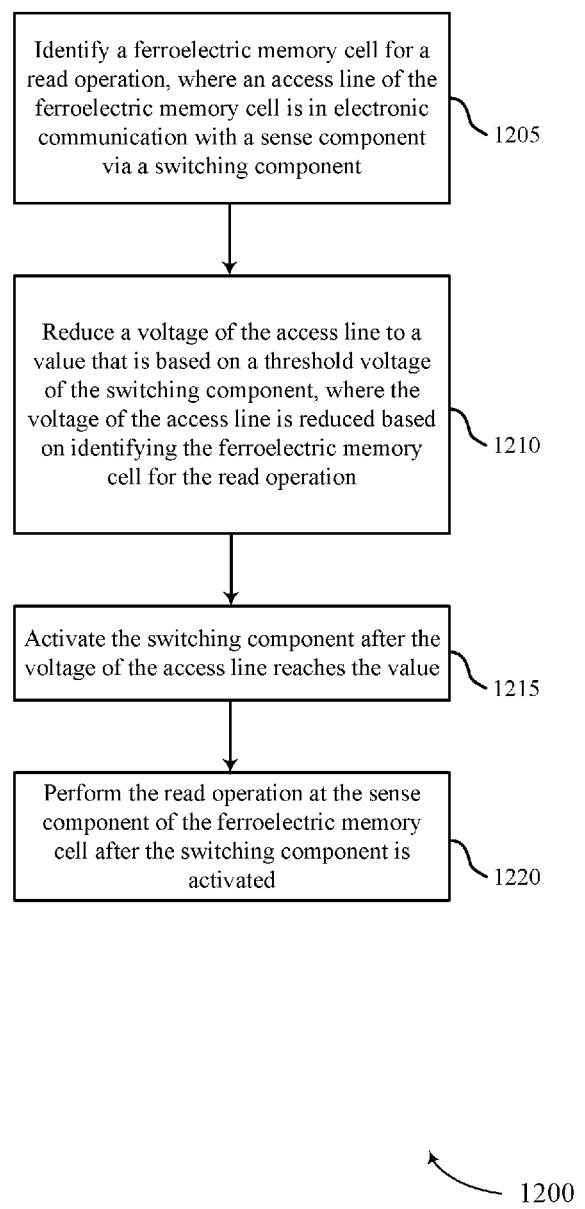
FIGS. 12 through 14 illustrate methods for compensation for threshold voltage variation in accordance with embodiments of the present disclosure.

FIG. 12 shows a flowchart illustrating a method 1200 for compensation for threshold voltage variation in accordance with various embodiments of the present disclosure. The operations of method 1200 may be implemented by a memory controller or memory array as described herein. For example, the operations of method 1200 may be performed by a memory controller as described with reference to FIGS. 9 through 11. In some examples, a memory controller may execute a set of codes to control the functional elements of the device to perform the functions described below. Additionally or alternatively, the memory controller may perform embodiments the functions described below using special-purpose hardware.

At block 1205, the method may include identifying a ferroelectric memory cell for a read operation, where an access line of the ferroelectric memory cell is in electronic communication with a sense component via a switching component. The operations of block 1205 may be performed according to the methods described with reference to FIGS. 2 through 8. In certain examples, aspects of the operations of block 1205 may be performed by a memory cell identifier as described with reference to FIGS. 9 through 11.

At block 1210, the method may include reducing a voltage of the access line to a value that is based at least in part on a threshold voltage of the switching component, where the voltage of the access line is reduced based at least in part on identifying the ferroelectric memory cell for the read operation. In some cases, reducing the voltage of the access line includes activating an additional switching component coupled between the access line and a voltage source for a predetermined period of time. Reducing the voltage of the access line may, in some cases, include establishing a conductive path between the switching component and a voltage source and activating the switching component for a period of time while the conductive path is established. In some applications, reducing the voltage of the access line includes activating an additional switching component coupled with the access line and a first voltage source and activating the switching component while a conductive path is established between the switching component and a second voltage source. The operations of block 1210 may be performed according to the methods described with reference to FIGS. 2 through 8. In certain examples, aspects of the operations of block 1210 may be performed by a voltage regulator as described with reference to FIGS. 9 through 11.

At block 1215, the method may include activating the switching component after the voltage of the access line reaches the value. The operations of block 1215 may be performed according to the methods described with reference to FIGS. 2 through 8. In certain examples, aspects of the operations of block 1215 may be performed by a switching component as described with reference to FIGS. 9 through 11.

At block 1220, the method may include performing the read operation at the sense component of the ferroelectric memory cell after the switching component is activated. The operations of block 1220 may be performed according to the methods described with reference to FIGS. 2 through 8. In certain examples, aspects of the operations of block 1220 may be performed by a read operation component as described with reference to FIGS. 9 through 11.

Figure 13:
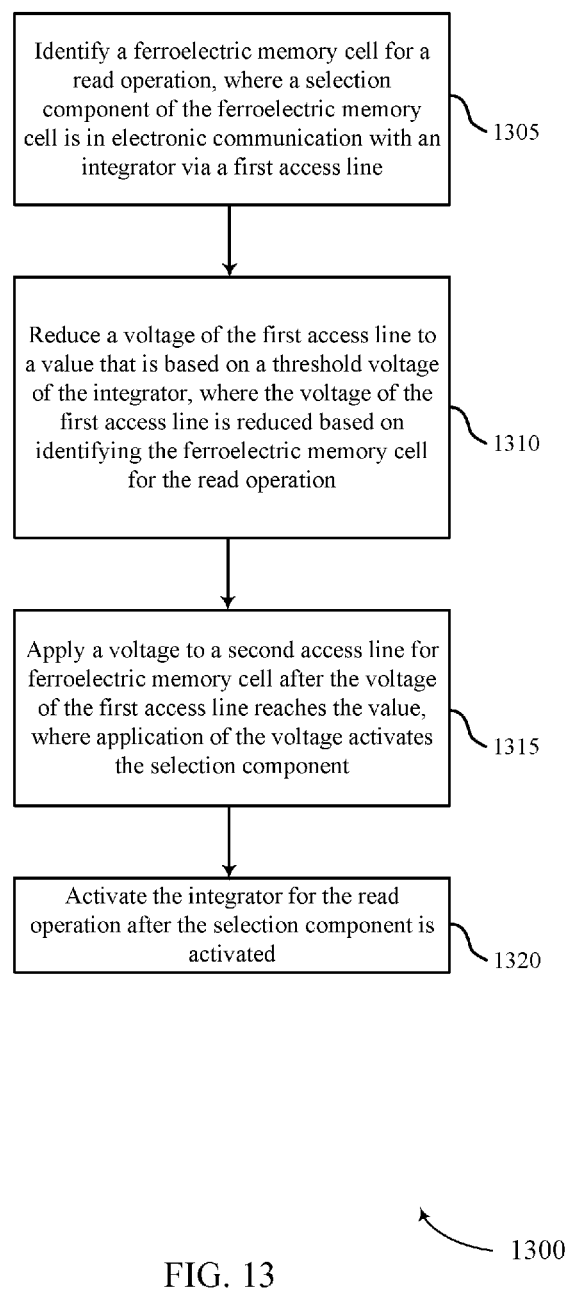

FIG. 13 shows a flowchart illustrating a method 1300 for compensation for threshold voltage variation in accordance with various embodiments of the present disclosure. The operations of method 1300 may be implemented by a memory controller or its components as described herein. For example, the operations of method 1300 may be performed by a memory controller as described with reference to FIGS. 9 through 11. In some examples, a memory controller may execute a set of codes to control the functional elements of the device to perform the functions described below. Additionally or alternatively, the memory controller may perform embodiments the functions described below using special-purpose hardware.

At block 1305, the method may include identifying a ferroelectric memory cell for a read operation, where a selection component of the ferroelectric memory cell is in electronic communication with an integrator via a first access line. The operations of block 1305 may be performed according to the methods described with reference to FIGS. 2 through 8. In certain examples, aspects of the operations of block 1305 may be performed by a memory cell identifier as described with reference to FIGS. 9 through 11.

At block 1310, the method may include reducing a voltage of the first access line to a value that is based at least in part on a threshold voltage of the integrator, where the voltage of the first access line is reduced based at least in part on identifying the ferroelectric memory cell for the read operation. In some cases, reducing the voltage of the first access line includes establishing a conductive path between the first access line and a voltage source via activation of a switching component. In some cases, reducing the voltage of the access line includes establishing a conductive path between the first access line and a voltage source via activation of the integrator. In some cases, reducing the voltage of the access line includes establishing a conductive path between the first access line and a first voltage source via activation of a switching component and establishing a conductive path between the first access line and a second voltage source via activation of the integrator. The operations of block 1310 may be performed according to the methods described with reference to FIGS. 2 through 8. In certain examples, aspects of the operations of block 1310 may be performed by a voltage regulator as described with reference to FIGS. 9 through 11.

At block 1315, the method may include applying a voltage to a second access line for ferroelectric memory cell after the voltage of the first access line reaches the value, where application of the voltage activates the selection component. The operations of block 1315 may be performed according to the methods described with reference to FIGS. 2 through 8. In certain examples, aspects of the operations of block 1315 may be performed by a voltage component as described with reference to FIGS. 9 through 11.

At block 1320, the method may include activating the integrator for the read operation after the selection component is activated. The operations of block 1320 may be performed according to the methods described with reference to FIGS. 2 through 8. In certain examples, aspects of the operations of block 1320 may be performed by a read operation component as described with reference to FIGS. 9 through 11.

Figure 14:
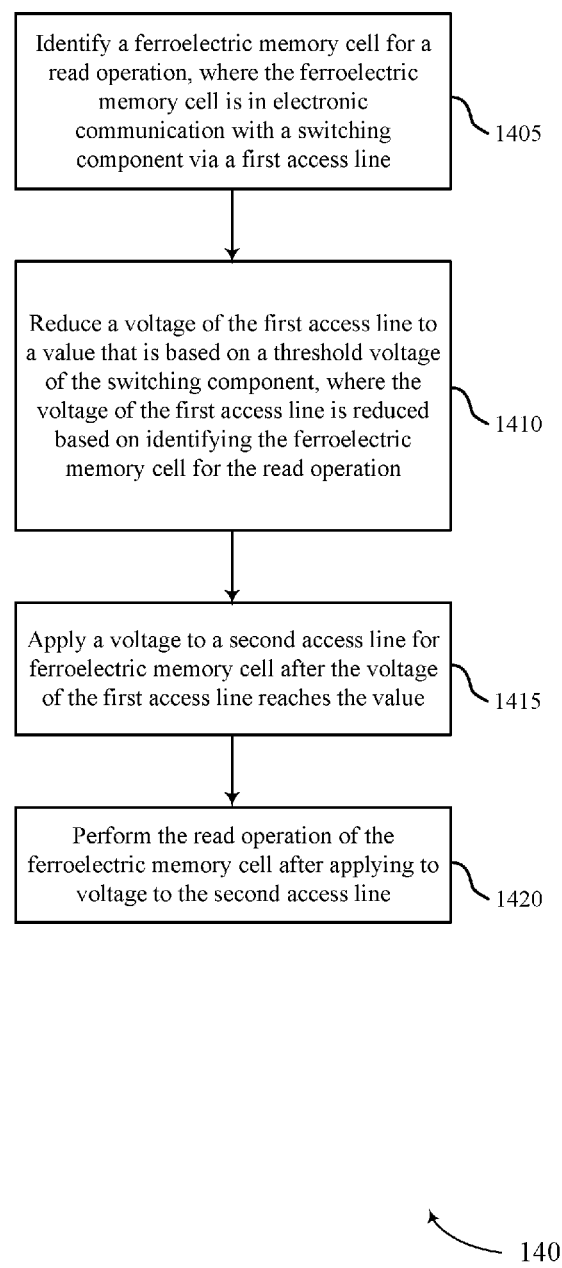

FIG. 14 shows a flowchart illustrating a method 1400 for compensation for threshold voltage variation in accordance with various embodiments of the present disclosure. The operations of method 1400 may be implemented by a memory controller or its components as described herein. For example, the operations of method 1400 may be performed by a memory controller as described with reference to FIGS. 9 through 11. In some examples, a memory controller may execute a set of codes to control the functional elements of the device to perform the functions described below. Additionally or alternatively, the memory controller may perform aspects the functions described below using special-purpose hardware.

At block 1405, the method may include identifying a ferroelectric memory cell for a read operation, where the ferroelectric memory cell is in electronic communication with a switching component via a first access line. The operations of block 1405 may be performed according to the methods described with reference to FIGS. 2 through 8. In certain examples, aspects of the operations of block 1405 may be performed by a memory cell identifier as described with reference to FIGS. 9 through 11.

At block 1410, the may include reducing a voltage of the first access line to a value that is based at least in part on a threshold voltage of the switching component, where the voltage of the first access line is reduced based at least in part on identifying the ferroelectric memory cell for the read operation. In some cases, reducing the voltage of the first access line includes establishing a conductive path between the first access line and a voltage source. The operations of block 1410 may be performed according to the methods described with reference to FIGS. 2 through 8. In certain examples, aspects of the operations of block 1410 may be performed by a voltage regulator as described with reference to FIGS. 9 through 11.

At block 1415, the method may include applying a voltage to a second access line for ferroelectric memory cell after the voltage of the first access line reaches the value. The operations of block 1415 may be performed according to the methods described with reference to FIGS. 2 through 8. In certain examples, aspects of the operations of block 1415 may be performed by a voltage component as described with reference to FIGS. 9 through 11.

At block 1420, the method may include performing the read operation of the ferroelectric memory cell after applying to voltage to the second access line. In some cases, performing the read operation includes applying a voltage to the ferroelectric memory cell, where the applied voltage transfers charge from the ferroelectric memory cell to a sense capacitor in electronic communication with a sensing circuit. The operations of block 1420 may be performed according to the methods described with reference to FIGS. 2 through 8. In certain examples, aspects of the operations of block 1420 may be performed by a read operation component as described with reference to FIGS. 9 through 11.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication" and "couple" or "coupled" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed). A switch, for example, that couples other components may facilitate electronic communication between the coupled components.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    identifying a ferroelectric memory cell for a read operation, wherein an access line of the ferroelectric memory cell is in electronic communication with a sense component via a switching component;
    reducing a voltage of the access line to a value that is based at least in part on a threshold voltage of the switching component, wherein the voltage of the access line is reduced based at least in part on identifying the ferroelectric memory cell for the read operation;
    activating the switching component after the voltage of the access line reaches the value;
    performing the read operation at the sense component of the ferroelectric memory cell after the switching component is activated; and
    isolating the ferroelectric memory cell from the access line before reducing the voltage of the access line.

2. The method of claim 1, wherein reducing the voltage of the access line comprises:
    activating an additional switching component coupled between the access line and a voltage source for a predetermined period of time.

3. The method of claim 1, wherein reducing the voltage of the access line comprises:
    establishing a conductive path between the switching component and a voltage source; and
    the method further comprising activating the switching component for a period of time while the conductive path is established.

4. The method of claim 1, wherein isolating the ferroelectric memory cell from the access line comprises:
    deactivating a selection component of the ferroelectric memory cell.

5. A method, comprising:
    identifying a ferroelectric memory cell for a read operation, wherein an access line of the ferroelectric memory cell is in electronic communication with a sense component via a switching component;
    reducing a voltage of the access line to a value that is based at least in part on a threshold voltage of the switching component, wherein the voltage of the access line is reduced based at least in part on identifying the ferroelectric memory cell for the read operation;
    activating the switching component after the voltage of the access line reaches the value and while a conductive path is established between the switching component and a second voltage source; and
    performing the read operation at the sense component of the ferroelectric memory cell after the switching component is activated;
    wherein reducing the voltage of the access line comprises: activating an additional switching component coupled with the access line and a first voltage source.

6. A method, comprising:
    identifying a ferroelectric memory cell for a read operation, wherein a selection component of the ferroelectric memory cell is in electronic communication with an integrator via a first access line;
    reducing a voltage of the first access line to a value that is based at least in part on a threshold voltage of the integrator, wherein the voltage of the first access line is reduced based at least in part on identifying the ferroelectric memory cell for the read operation;
    applying a voltage to a second access line of the ferroelectric memory cell after the voltage of the first access line reaches the value, wherein application of the voltage activates the selection component; and
    activating the integrator for the read operation after the selection component is activated.

7. The method of claim 6, wherein reducing the voltage of the first access line comprises:
    establishing a conductive path between the first access line and a voltage source via activation of a switching component.

8. The method of claim 6, wherein reducing the voltage of the first access line comprises:
    establishing a conductive path between the first access line and a voltage source via activation of the integrator.

9. The method of claim 6, wherein reducing the voltage of the first access line comprises:
    establishing a conductive path between the first access line and a first voltage source via activation of a switching component; and
    the method further comprising establishing a conductive path between the first access line and a second voltage source via activation of the integrator.

10. The method of claim 6, wherein activating the selection component establishes a conductive path between the ferroelectric memory cell and a sense capacitor and applying the voltage to the second access line transfers charge from the ferroelectric memory cell to the sense capacitor.

11. The method of claim 10, wherein activating the integrator transfers current from the sense capacitor.

12. The method of claim 10, further comprising:
    determining that the first access line has reached a threshold value; and
    deactivating the integrator based at least in part on the determination.

13. The method of claim 12, further comprising:
    determining a period of time the integrator is active; and
    determining a stored state of the ferroelectric memory cell based at least in part on a duration of the period of time.

14. A method, comprising:
    identifying a ferroelectric memory cell for a read operation, wherein the ferroelectric memory cell is in electronic communication with a switching component via a first access line;
    reducing a voltage of the first access line to a value that is based at least in part on a threshold voltage of the switching component, wherein the voltage of the first access line is reduced based at least in part on identifying the ferroelectric memory cell for the read operation;
    applying a voltage to a second access line of the ferroelectric memory cell after the voltage of the first access line reaches the value; and
    performing the read operation of the ferroelectric memory cell after applying to voltage to the second access line.

15. The method of claim 14, wherein reducing the voltage comprises:
establishing a conductive path between the first access line and a voltage source.

16. The method of claim 15, wherein establishing the conductive path comprises:
activating an additional switching component coupled with the first access line and the voltage source.

17. The method of claim 15, wherein establishing the conductive path comprises:
activating the switching component coupled with the first access line and the voltage source.

18. The method of claim 14, wherein performing the read operation comprises:
applying a voltage to the ferroelectric memory cell, wherein the applied voltage transfers charge from the ferroelectric memory cell to a sense capacitor in electronic communication with a sensing circuit.

19. An electronic memory apparatus, comprising:
a ferroelectric memory cell;
a first access line and a second access line, wherein the ferroelectric memory cell is in electronic communication with a switching component via the first access line; and
a controller in electronic communication with the ferroelectric memory cell and the switching component, wherein the controller is operable to:
identify the ferroelectric memory cell for a read operation;
reduce a voltage of the first access line to a value that is based at least in part on a threshold voltage of the switching component, wherein the voltage of the first access line is reduced based at least in part on identifying the ferroelectric memory cell for the read operation;
trigger a read operation of the ferroelectric memory cell after reducing the voltage of the first access line; and
apply a voltage to the second access line to activate a selection component of the ferroelectric memory cell.

20. The electronic memory apparatus of claim 19, wherein the controller is operable to:
activate the switching component, wherein the switching component is coupled to a voltage source; and
reduce the voltage of the first access line to the value based at least in part on activating the switching component.

21. The electronic memory apparatus of claim 19, wherein the controller is operable to:
activate an additional switching component;
reduce the voltage of the first access line to a threshold value greater than the value based at least in part on activating the additional switching component;
activate the switching component after activating the additional switching component; and
reduce the voltage of the first access line from the threshold value to the value based at least in part on activating the switching component.

22. The electronic memory apparatus of claim 21, wherein the controller is operable to:
apply a voltage to activate the switching component after applying the voltage to the second access line.

23. An electronic memory apparatus, comprising:
a ferroelectric memory cell;
a first access line and a second access line, wherein the ferroelectric memory cell is in electronic communication with a switching component via the first access line; and
a controller in electronic communication with the ferroelectric memory cell and the switching component, wherein the controller is operable to:
identify the ferroelectric memory cell for a read operation;
reduce a voltage of the first access line to a value that is based at least in part on a threshold voltage of the switching component, wherein the voltage of the first access line is reduced based at least in part on identifying the ferroelectric memory cell for the read operation;
trigger a read operation of the ferroelectric memory cell after reducing the voltage of the first access line;
activate an additional switching component, wherein the additional switching component is coupled to a voltage source; and
reduce the voltage of the first access line to the value based at least in part on activating the additional switching component.

* * * * *